US006469899B2

(12) United States Patent
Hastings et al.

(10) Patent No.: US 6,469,899 B2
(45) Date of Patent: Oct. 22, 2002

(54) MODULAR RACK-MOUNT SERVER ARRANGEMENT

(75) Inventors: Robert J. Hastings, Kingwood; Paily T. Varghese, Houston; Thomas P. Jasso, Spring; Kevin B. Leigh, Houston, all of TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/742,755

(22) Filed: Dec. 20, 2000

(65) Prior Publication Data

US 2002/0075656 A1 Jun. 20, 2002

(51) Int. Cl.[7] .................................................. H05H 7/20
(52) U.S. Cl. ........................ 361/724; 361/727; 361/790; 248/65; 360/97.8
(58) Field of Search ................................. 361/724–727, 361/679, 680, 683–686, 784, 790; 360/97.8; 248/65; 710/102

(56) References Cited

U.S. PATENT DOCUMENTS

| | | | | |
|---|---|---|---|---|
| 5,388,032 A | * | 2/1995 | Gill et al. .................... | 361/681 |
| 6,181,549 B1 | * | 1/2001 | Mills et al. .................. | 361/683 |
| 6,208,522 B1 | * | 3/2001 | Manweiler et al. ......... | 361/752 |

* cited by examiner

Primary Examiner—Darren Schuberg
Assistant Examiner—Hung Van Duong
(74) Attorney, Agent, or Firm—Conley, Rose & Tayon, P.C.

(57) ABSTRACT

A system to mount several electronic devices within a one EIA unit high rackspace is presented. The system includes a mounting chassis that is securely fastened to a standard 19" EIA electronics rack. The chassis includes dividers that define at least two full length ports in which the electronic devices are slidably engaged. Furthermore, each port defined by the mounting tray includes hot-pluggable, blind-mate sockets to receive corresponding hot-pluggable, blind-mate connectors upon each electronics package. These packages are engaged and disengaged to and from the ports within the rack at will, thus allowing for more servers to be efficiently and accessibly stored within the confines of a 1-U rackspace with interchangeability than was previously possible.

19 Claims, 3 Drawing Sheets

MODULAR RACK-MOUNT SERVER ARRANGEMENT

CROSS-REFERENCE TO RELATED APPLICATIONS

Not Applicable.

TECHNICAL FIELD OF THE INVENTION

The present invention relates to a structural method of arranging electronic packages within a standard electronics rack housing. More particularly, the present invention relates to a system of arranging electronic packages within an electronics rack so that rack space is used more efficiently and that rapid exchanges of the electronics packages is possible.

BACKGROUND OF THE INVENTION

The necessity for specialized computer equipment has increased dramatically over recent years. Corporations, both large and small, as well as individual consumers have come to depend on computers to enhance and assist them in a broad assortment of tasks. For the individual or small business, personal computers are typically relatively compact and streamlined, often comprising a monitor, a keyboard, a mouse, and a CPU "box" that sits on a desktop or on the floor. These personal computers, although considered compact when deployed in relatively small numbers, can be quite cumbersome and bulky when deployed in larger quantities. It is not uncommon for an organization to require several computers to act as servers controlling their local area networks. Even the networks of small companies run more efficiently when specific tasks are split up among individual servers. Typically, the small company will have a room with several servers, all in standard CPU cases consuming a significant amount of space.

For larger corporations that require numerous servers, the traditional CPU package is not practical to house servers. Larger companies, especially "e-businesses" that use the internet and the world wide web to conduct their commerce, require a higher number of servers than that required by smaller businesses. Such organizations, and in particular the internet service providers, or ISPs, must be able to pack far more server appliances within a limited amount of space than would be conceivable using traditional desktop chassises. For such operations, an industry standard EIA (Electronics Industries Alliance) rack is often used to contain servers in a stacked arrangement that uses the available space more efficiently.

Such electronics racks are a relatively simple structure that closely resemble an open-frame bookcase without shelves. Computer server/component racks are typically constructed with perforated, hinged front-doors, rigid sides and a removable rear panel. Often, the rear panel of an electronics rack is constructed as a hinged, perforated door that is allowed to be opened and swung out of the way when access from the rear is desired. Within the rack exterior, or "shell," formed by the sides and back panel is a structural frame. The rack frame is capable of supporting the weight of the electronics contained within the rack and serves as the primary means of securing components therein. The rack frame, closely resembles an industrial shelving unit and typically includes four rigid corner posts, connected to each other with a plurality of cross members and structural supports. Each of the four corner posts include a plurality of mounting holes, though which electronic components can be secured.

Industry standard 19" EIA electronics racks are designed typically to house a column of electronics packages that are 17 ¾" in width and with varying depths. The height of an electronics package can vary but, to be compatable with the rack mounting structure, must be an integer multiple of an EIA unit called simply the "U." An EIA U is 1.75 inches. Electronic equipment generally has a height in multiples of "U's" e.g., 1U (1.75"), 2U (3.50"), 3U (5.25"), etc. A piece of equipment whose height is not an integer multiple of a U will not efficiently use rack space. Standard equipment racks are available in a wide assortment of heights, but the most common is of 42U height.

Typically, electronic packages are mounted in the rack from the front and secured in place with fasteners, specifically thumbscrews. The thumbscrews allow frequent installation and removal of the electronic packages with minimal effort and without hand tools. Power and data connections are preferably made by opening the rear panel of the rack and accessing the rear surface of the mounted device. If a piece of equipment is heavy or does not include features that allow it to be secured properly to the rack, a rack shelf can be secured in place to the rack frame to support the non-standard device. Alternatively, electronic components may be secured within the rack using a pair of drawer slides. The drawer slides, usually ball-bearing supported rails, are secured in place within the rack frame. Corresponding rails are located on the side surfaces of the electronics component to be mounted, thus allowing the component to be pulled in and out of the rack frame easily to allow quick and frequent access.

Although it is preferred that the height of the electronics components be a multiple of the standard EIA unit U, the dimension of the EIA unit is understood to represent a maximum allowable height. Two adjacent 1U height electronic devices will require a finite amount of clearance. This amount of clearance aides in the installation of the rack mounted electronics and promotes interference free insertion and removal. For a device that is much less heat intensive, for example an internet server, an overall height of 1.65" (with 0.05" clearance above and below) can be used for a 1-U package. In either example, a few thousandths of an inch of clearance room must be vacated to enable ease of installation.

A piece of electronics equipment that is mounted in a chassis may vertically span more than one EIA unit of height. For example, a power supply module could be mounted into an EIA rack system and allotted a vertical space equivalent to 4Us (1.75"×4=7"). If the manufacturer desires a minimum vertical clearance allowance (top and bottom) of 0.100 inches for example, the power supply could then be constructed to be 6.800 inches [(7.000−(2× 0.010)] in height without concern for interfering with the installation or operation of adjacent pieces of equipment.

Of course, it is always desirable to make electronic equipment smaller. Smaller electronic equipment means that more pieces of equipment can be housed in a rack. Unfortunately, as the desire for miniaturization of electronics devices progresses, the standard minimum vertical amount of rack space, 1-U, has remained substantially unchanged. Since the U represents a minimum height, a piece of equipment that has a height that is less than 1.75" must still be mounted so as to take up a full U of height. To compensate for the required height, compact equipment often will not extend to the full depth (15" vs. 30", for example) of the rack. When components that do not extend the full depth are mounted in a standard rack, space can be wasted and an important benefit of the rack mounting of components is diminished. While it would be possible to design a new rack system with a new set of standards for equipment size, it is preferable to create a means to modify the storage capabilities of current EIA racks to allow more storage configurations to be achievable within the confines of a standard "legacy" rack. Many companies have already invested significant amounts of money on their current facilities and equipment and would prefer not to have to change their equipment. Furthermore, it is not entirely practical to arrange systems to occupy less than a full EIA unit of height as devices that are often accessed at the front of a rack-mounted package (e.g., disk drives) require more height than such an arrangement would allow.

In an attempt to conserve rack space, some have mounted two half-depth, 1-U systems in a rack, one from the front and another from the back of a 1-U space, in a "back-to-back" configuration with limited success. Although this method allows two devices to be secured within a single space, much of the functionality and benefit of the rack design is lost. For instance, because the systems are mounted "back-to-back," the cabling that is required to power and communicate with the equipment located toward the back of the rack is now located in the center of the rack, in a location generally inaccessible without removing at least one electronic package. Further, these cables must be redirected either through a side or the middle of the rack in a manner that is completely unserviceable to a system administrator without disabling some of the affected components.

Because EIA racks are so widely deployed and already represent a highly efficient means to package and store electronic components, a method to store more equipment within the confines of an existing EIA rack is highly desirable. Currently, there is no known way to conveniently house two, three, or more distinct electronic packages within a 1-U EIA rackspace from the front and trends in server appliance miniaturization and redundancy are increasingly demanding such a feature. The ease of installation, removal, replacement, and interchangeability would be greatly improved with a system that could efficiently pack such equipment.

BRIEF SUMMARY OF THE INVENTION

The present invention overcomes the deficiencies of the prior art by providing a system to mount several servers within a 1-U space of a standard EIA electronics rack. The system includes a mounting tray, or chassis, that is securely fastened to a standard 19" EIA electronics rack. The tray includes dividers that define at least two full length ports per EIA unit into which electronic packages are slidably engaged. Furthermore, each port defined by the mounting tray includes hot-pluggable blind-mate sockets to receive corresponding hot-pluggable blind-mate connectors upon each electronics package. These packages are engaged and disengaged to and from the ports within the rack at will, thus allowing for more servers to be efficiently and accessibly stored within the confines of a 1-U rackspace than was previously possible.

BRIEF DESCRIPTION OF THE DRAWINGS

For a more detailed description of the preferred embodiment of the present invention, reference will now be made to the accompanying drawings, wherein.

DETAILED DESCRIPTION OF THE PREFERRED EMBODIMENTS

Figure 1:
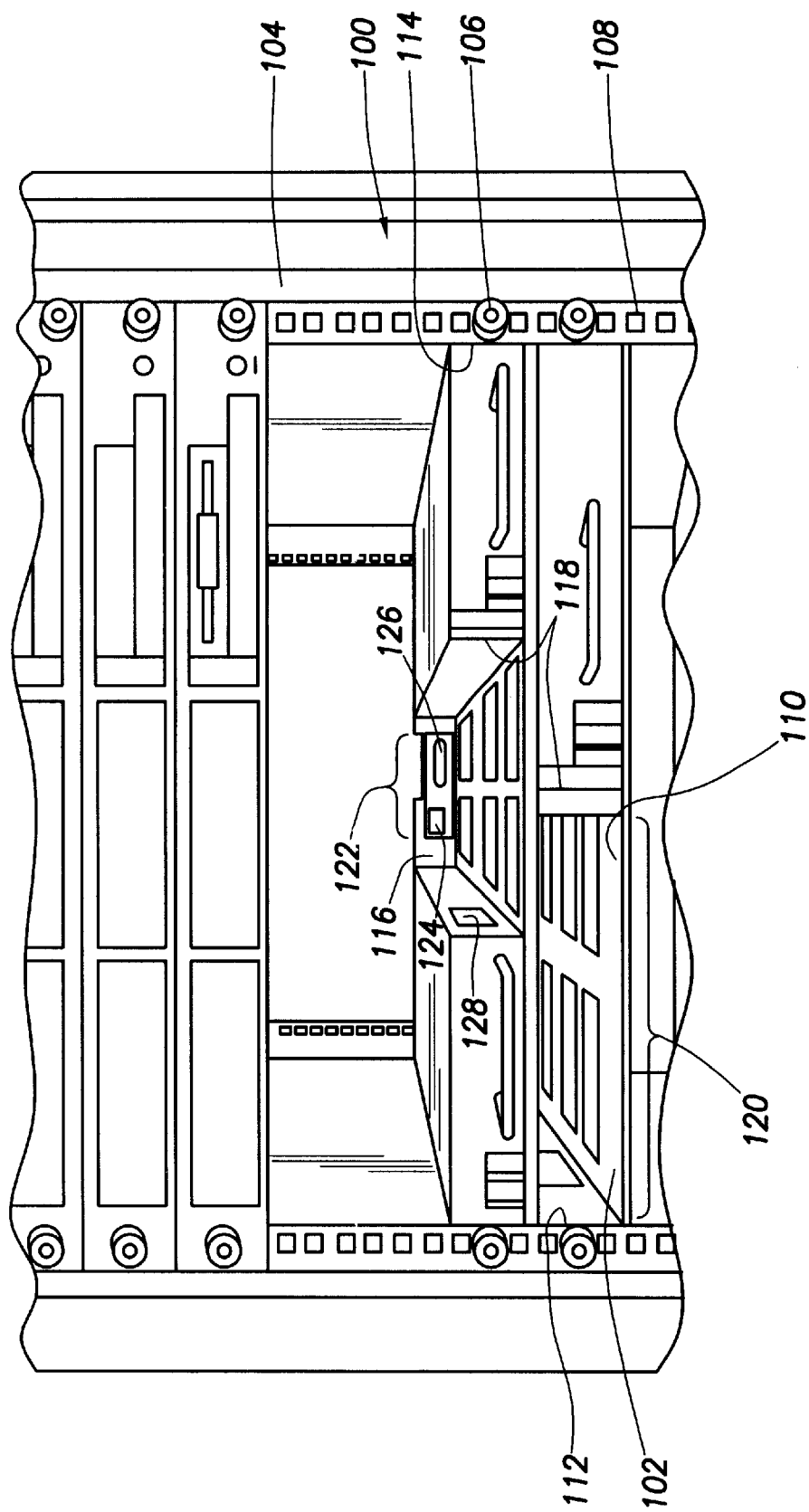
FIG. 1 a perspective view drawing of an interchangeable server mount system in accordance with a preferred embodiment of the present invention.

Referring now to FIG. 1, an interchangeable electronics rack mount system 100 is shown. Interchangeable rack mount system includes a mounting chassis 102 positioned preferably within a 1U rackspace of a standard 19" EIA rack assembly 104. Mounting chassis 102 preferably spans the width of the rack assembly 104. A standard 1U space of EIA standard 19" rack 104 is 1.75 inches of height, 17 ¾ inches of usable width, and a varying degree of depth (preferably 30 inches). Mounting chassis 102 is positioned horizontally within rack 104 and secured in place by captive thumbscrews 106. Rack 104 includes a plurality of vertically spaced mounting apertures 108 that receive screws 106.

Mounting chassis 102 preferably includes a bottom 110, a left and right side 112, 114, and a rear wall 116. At least one divider 118 is mounted to the chassis bottom 110 and runs from the front of chassis 102 to the rear wall 116. The divider 118 divides the chassis into multiple docking parts 120. One divider 118 results in two docking parts. Two dividers create three docketing parts, and so on. Divider 118 is positioned substantially parallel to sides 112 and 114. By placing dividers 118 at various positions within chassis 102 parallel to sides 112, 114, different sized docking ports 120 can be created. Although it is preferable for each chassis 102 to contain 2 or 3 equally sized docking ports 120, it should be understood that the relative size and number of ports 120 within chassis 102 can be any number desired. Preferably, located within the front left side of each port 120, is a latch recess 128. Recess 128 can take the form of a simple cutout in a divider 118 or in the left or right side 112, 114 of chassis 102. At the rear of each port 120 of chassis 102 is a docking bulkhead 122 that receives power and data connections of a piece of equipment inserted into docking port 120. Referring still to FIG. 1, bulkhead 122 preferably includes sockets that mate with corresponding blind-mate connectors on the piece of equipment in docking port 120. Although a variety of sockets can be used, preferably at least one power socket 124 and at least one communications socket 126 are included in the docking bulkhead 122.

Figure 2:
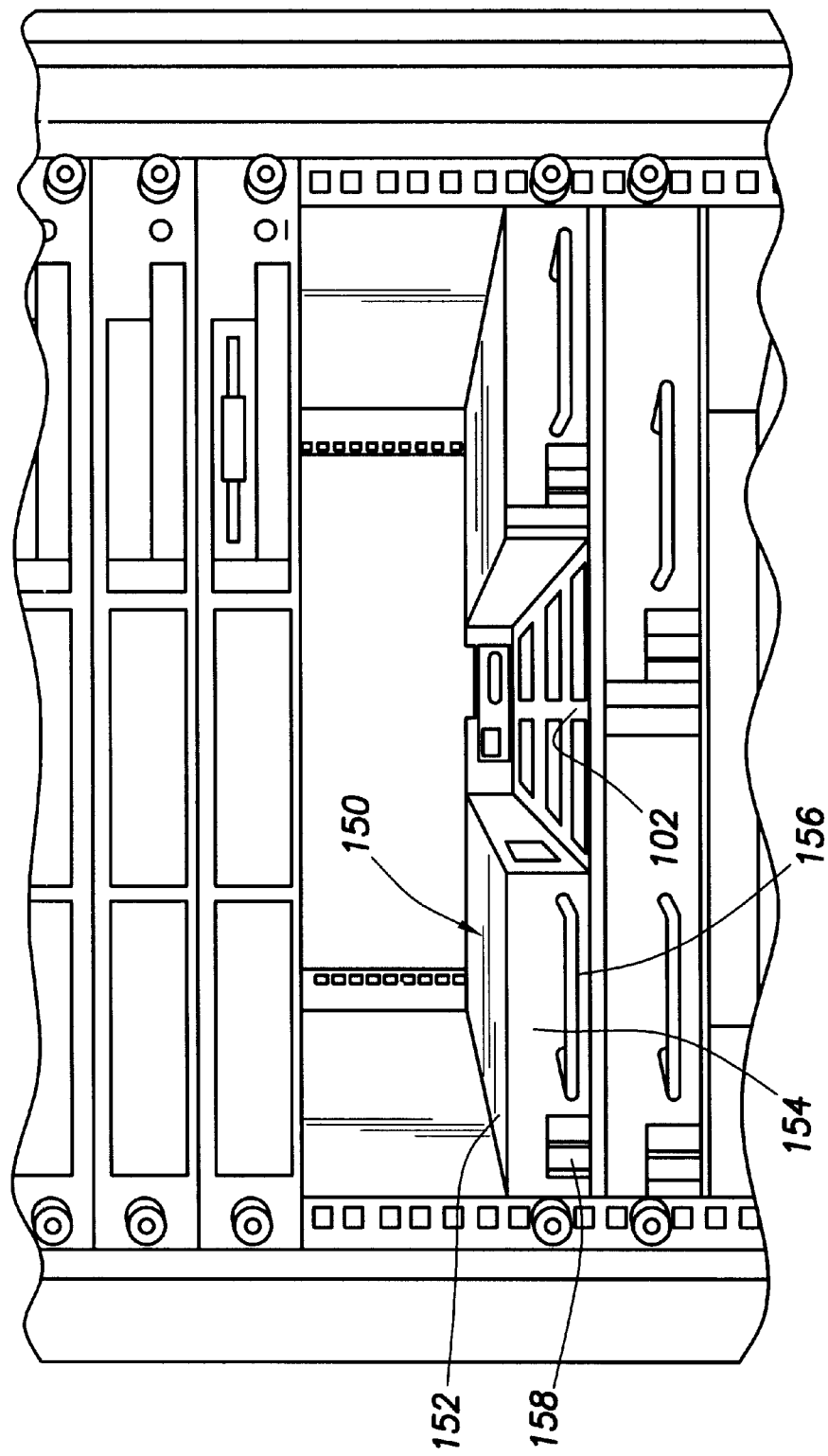
FIG. 2 is a perspective view drawing of an electronic package in accordance with a preferred embodiment, of the present invention that is to be contained within the server mount system of FIG. 1.

Referring now to FIG. 2, an electronics package 150 is shown disposed within a docking port 120. The electronics package can be any type of digital or analog device such as a server, a storage system, or a power supply. Electronics package 150 is preferably constructed with a housing 152 and a front panel 154. Front panel 154 preferably includes a handle 156 and a latch 158 for securing package 150 in position within mounting chassis 102. Although not shown in FIG. 2, front panel 154 can include accessible floppy and CD-ROM drives to allow a user to upload and download data and configuration settings to a computing device contained within package 150.

Figure 3:
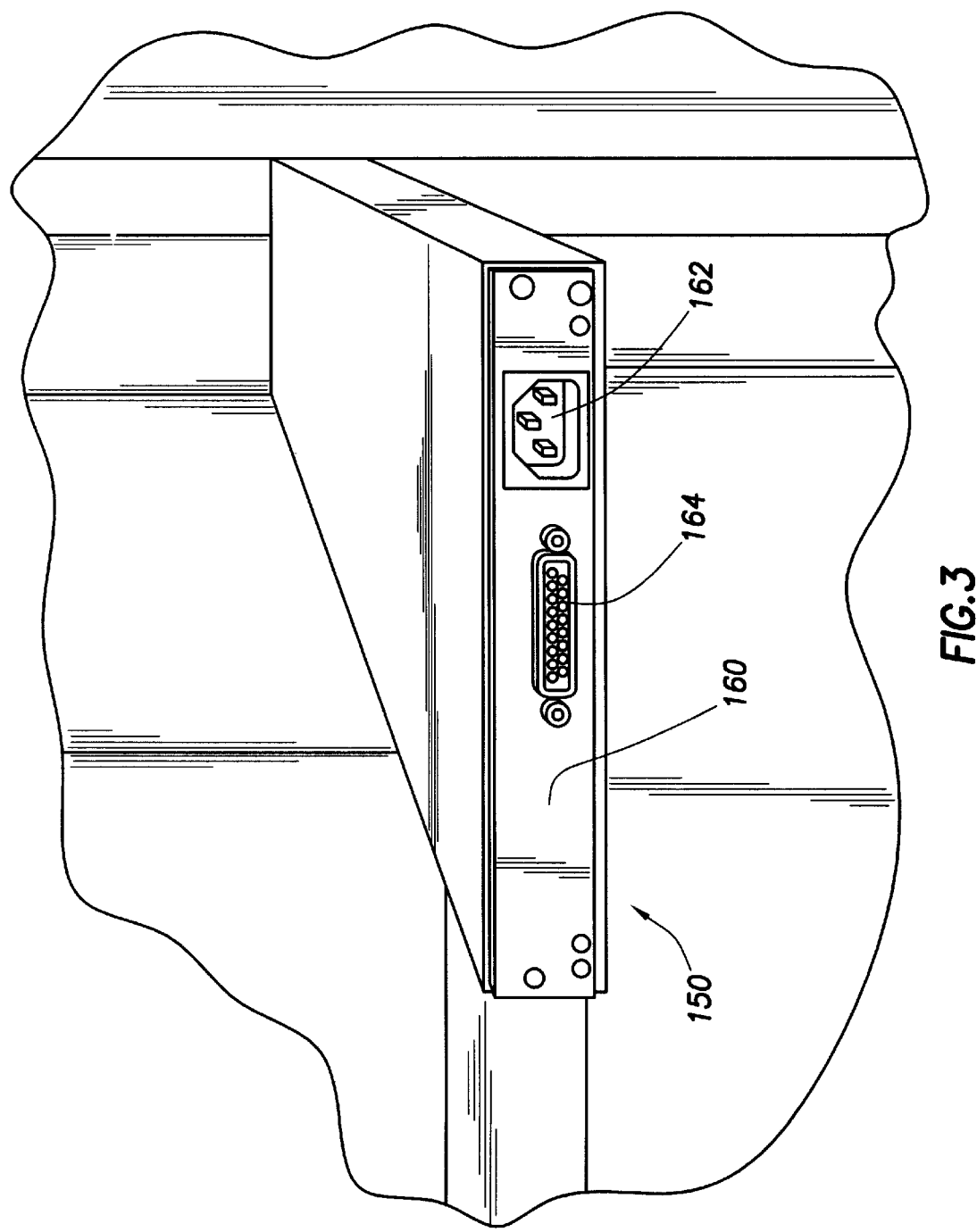
FIG. 3 is a rear view perspective view drawing of the electronic package of FIG. 2.

Referring now to FIG. 3, the rear surface of electronics package 150 is shown as having a rear panel 160 with power and communications hot-pluggable blind mate connections 162 and 164 which mate with the power and communications sockets 124, 126 of bulkhead 122 of FIG. 1. As blind mating hot-pluggable connectors, connectors 162, 164 automatically connect to corresponding bulkhead sockets 124, 126 when the electronics package 150 is fully inserted into docking port 120.

Referring to FIGS. 1–3 together, electronics rack mount system 100 is installed by first installing chassis 102 into rack 104 and securing with thumbscrews 106. Chassis 102 is constructed to fit within the limitations of 1-U of EIA rackspace and multiple chassis 102 can be installed within vertically adjacent rack spaces together to form an array of ports 120. For example, five chassises 102, each with 3 ports 120, could be stacked on top of each other in a rack to form an array of 15 docking ports 120. Alternatively, a single chassis can be constructed to span vertically across more than one EIA unit and thus hold an array of ports 120. For example, the 15-port array mentioned above could be created by installing a single 5-U chassis with each "U" containing 3 docking ports 120. A potential advantage of such an arrangement could include the ability to share a common power or data distribution system across the entire array. For example, one power cable could be used to supply power to each of the power sockets in the array, thus eliminating a significant amount of cable clutter at the rear of rack 104.

Once chassis 102 is secured within rack 104, connections at the rear of rack 104 are made to connect the sockets of each port 120 to power and communications cables. With the chassis 102 installed and connected, the server mount system 100 is ready for operation. Electronics packages 150 are slidably engaged into ports 120 created by dividers 118 and side rails 112, 114. Packages 150 are slid into the ports 120 until they contact against rear wall 116 of chassis. As electronics packages 150 contact against rear wall 116, blind-mate hot-pluggable connectors 162, 164 of rear panel 160 mate with bulkhead socket connectors 124, 126. Power socket 126 of bulkhead 122 mates with power receptacle 162 of package 150 and communications socket 124 mates with connector 164. When fully engaged into aport 120, spring-loaded latch 158 of electronics package 150 engages recess 128 within chassis 102, thus preventing removal of packages from server mount system 100. When removal of package 150 is desired, the user slides latch 158 away from recess 128 and can then remove package 150 by grasping handle 156 and pulling package 150 away from port 120. Furthermore, a latch activated electronic sensor (not shown) may be included within latches 158 to notify a system to prepare itself for its removal from a port 120.

Electronics mount system 100 offers the user the ability to replace servers, or any other electronic device, quickly and with little effort. Furthermore, the electronics mount system 100 of the present invention represents a dramatic improvement to the device capacity of a standard EIA rack. With conventional designs, it was only practical to store one component within a 1-U unit of rackspace. Alternative methods for housing several components within a single rackspace eliminated much of the functionality and convenience that is associated with the EIA rack mount design. A system in accordance with the preferred embodiment of the present invention allows the installation of multiple, full length packages within a single standard 1-U rackspace. By increasing the number of packages (from 1 per EIA unit to 2 or 3) rack users that require a high number of servers, or any other rack mounted components, can store them more efficiently. This more efficient use of the storage space within an EIA rack allows businesses to expand their computing power and customer base without need for more office space.

In deploying a system in accordance with the preferred embodiment of the present invention, EIA Rack users can store multiple appliances within a single rack space without departing from the features and spirit of the EIA rack mount concept. Such features include, but are not limited to, ease of installation into and removal from the rack, front panel access and input to the system, and connection access to the rear of the system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

What is claimed is:

1. A server array to be mounted within an electronics rack, the server array comprising:

a chassis, said chassis removably secured within the rack and including a front, a back, a left side, and a right side;

at least two docking ports extending from said front to said back, said docking ports being substantially parallel to said left and said right sides of said chassis;

said docking ports configured to receive a server package in slidable engagement;

said back of said chassis including a connection bulkhead for each of said docking ports; and the server package including hot-pluggable, blind-mate connections to correspond with said connection bulkhead.

2. The system according to claim 1 wherein said chassis is approximately one EIA unit of height.

3. The system according to claim 1 wherein said chassis is more than one EIA unit of height.

4. A system to mount electronic equipment within an electronics rack, comprising:

a chassis removably secured within the rack, said chassis including first and second sides, a front, and a back;

at least one divider rail extending from said front to said back of said chassis and dividing said chassis into two docking locations for the electronics equipment, wherein said chassis is more than one EIA unit of height and said chassis creates an array of said docking locations.

5. A system to mount electronic equipment within an electronics rack, comprising:

a chassis removably secured within the rack, said chassis including first and second sides, a front, and a back;

at least one divider rail extending from said front to said back of said chassis and dividing said chassis into two docking locations for the electronics equipment whereby multiple chassis are mounted in adjacently in the rack, said adjacently mounted trays creating an array of said docking locations.

6. A system to mount electronic equipment within an electronics rack, comprising:

a chassis removably secured within the-rack, said chassis including first and second sides, a front, and a back;

at least one divider rail extending from said front to said back of said chassis and dividing said chassis into two docking locations for the electronics equipment, wherein said back of said chassis includes a connection bulkhead for each of said docking locations, said connection bulkhead including a communications connection for the electronic equipment.

7. The system according to claim 6 wherein said electronic equipment includes a mating connector configured to mate with said communications connection of said bulkhead in a blind mating and hot-pluggable operation to make a connection therebetween.

8. The system according to claim 6 wherein said connection bulkhead further includes a power connection for the electronic equipment.

9. A system to mount a plurality of computer systems within an electronics rack, comprising:
- a chassis tray removably secured within the rack, said chassis including a first side, a second side, a front and a back;
- at least two docking locations within said chassis tray;
- said back of said chassis tray including a connection bulkhead for each of said docking locations, said connection bulkheads including communications connections for the computer systems;
- an electronic package to be engaged within each of said docking locations, said electronic package containing the computer systems and mating system connections; and
- said mating system connections configured to mate with said communications connections of said bulkheads in a hot-pluggable blind mating operation to make a secure connection therebetween.

10. The system according to claim 9 wherein said chassis consumes one EIA unit of height within the rack.

11. The system according to claim 9 wherein said chassis consumes more than one EIA unit of height within the rack.

12. The system according to claim 9 wherein said chassis are configured to be interchangeably engaged within at least two of said docking locations.

13. The system according to claim 10 whereby multiple chassis are mounted in adjacent spaces in the rack, said adjacently mounted trays creating an array of said docking locations.

14. The system according to claim 11 wherein said multi-unit chassis creates an array of said docking locations.

15. A system to mount electronic equipment within an electronics rack, comprising:
- a chassis removably secured within the rack, said chassis including first and second sides, a front, and a back;
- at least one divider rail extending from said front to said back of said chassis and dividing said chassis into two docking locations for the electronics equipment.

16. The system according to claim 15 whereby multiple chassis are mounted in adjacent locations in the electronics rack.

17. A method for mounting multiple electronic packages within a rackspace, the method including:
- installing a sub-chassis within a rack;
- the sub-chassis defining docking ports, each of the docking ports including a hot-pluggable, blind-mating communications connection;
- engaging the electronic packages within the docking ports until corresponding connectors of the packages connect with the blind mating communications connection of the docking ports; and
- engaging a latch device to secure each electronic package in place until removal is desired.

18. An array of server appliances to perform computing tasks, the array including a plurality of individual server systems mounted side by side within a chassis that occupies a single EIA unit of height within a rack.

19. An array of server systems to perform computing tasks, the array including a plurality of individual server systems mounted side by side within a chassis that occupies a single EIA unit of height within a rack, said server systems including communications ports to blindly hot mate with the chassis to allow their installation and removal without requiring manual electrical make-up or break-out of server system with respect to the chassis.

* * * * *